United States Patent

Morimoto

(10) Patent No.: US 8,878,543 B2
(45) Date of Patent: Nov. 4, 2014

(54) VEHICULAR INSULATION RESISTANCE DETECTION APPARATUS

(75) Inventor: Naohisa Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 413 days.

(21) Appl. No.: 13/498,068

(22) PCT Filed: May 27, 2011

(86) PCT No.: PCT/JP2011/002986
§ 371 (c)(1),
(2), (4) Date: Mar. 23, 2012

(87) PCT Pub. No.: WO2012/029214
PCT Pub. Date: Mar. 8, 2012

(65) Prior Publication Data
US 2012/0280697 A1 Nov. 8, 2012

(30) Foreign Application Priority Data
Aug. 31, 2010 (JP) .................................. 2010-194404

(51) Int. Cl.
| | |
|---|---|
| G01R 31/00 | (2006.01) |
| G01R 27/14 | (2006.01) |
| B60L 3/00 | (2006.01) |
| G01R 27/18 | (2006.01) |
| G01R 31/02 | (2006.01) |

(52) U.S. Cl.
CPC ............... *G01R 27/18* (2013.01); *B60L 3/0069* (2013.01); *G01R 31/025* (2013.01)
USPC .......................................... 324/503; 324/691

(58) Field of Classification Search
None
See application file for complete search history.

(56) References Cited

U.S. PATENT DOCUMENTS

| 6,919,726 B2 | 7/2005 | Yudahira | |
|---|---|---|---|
| 7,560,935 B2 * | 7/2009 | Morimoto | ...................... 324/525 |

(Continued)

FOREIGN PATENT DOCUMENTS

| CN | 1504754 A | 6/2004 |
|---|---|---|
| CN | 1987494 A | 6/2007 |

(Continued)

OTHER PUBLICATIONS

International Search Report issued in International Patent Application No. PCT/JP2011/002986, dated Aug. 30, 2011.

(Continued)

*Primary Examiner* — Vinh Nguyen
(74) *Attorney, Agent, or Firm* — McDermott Will & Emery LLP

(57) ABSTRACT

The vehicular insulation resistance detection apparatus includes a cyclic signal generating unit that generates a cyclic signal, a first resistor that has one end to which the cyclic signal is applied, a first capacitor that has one end connected to the other end of the first resistor and the other end connected to a high-voltage circuit, a second capacitor that has one end connected to the other end of the first resistor, a second resistor that has one end connected to the other end of the second capacitor and the other end connected to a low-voltage ground that is a circuit ground of a low-voltage circuit, a series circuit that includes a diode and a third resistor connected in series, and is connected in parallel with the second capacitor, this diode having a forward direction coincident with a direction from the other end of the second capacitor to the one end of the second capacitor, a voltage detection unit that detects a voltage between the low-voltage ground and the other end of the second capacitor as a detection signal, and an insulation resistance detection unit that detects a resistance value of an insulation resistance based on an amplitude of the detection signal.

5 Claims, 13 Drawing Sheets

(56) References Cited

U.S. PATENT DOCUMENTS

| | | |
|---|---|---|
| 2005/0012506 A1 | 1/2005 | Yudahira |
| 2007/0132459 A1* | 6/2007 | Yamamoto et al. ........... 324/541 |
| 2008/0197855 A1 | 8/2008 | Uchida |
| 2011/0012606 A1* | 1/2011 | Kawamura .................... 324/509 |
| 2011/0140714 A1* | 6/2011 | Hernando et al. ............ 324/551 |

FOREIGN PATENT DOCUMENTS

| | | |
|---|---|---|
| CN | 2938123 Y | 8/2007 |
| JP | 2003-194870 A | 7/2003 |
| JP | 2004-104923 A | 4/2004 |
| JP | 2007-187454 A | 7/2007 |
| JP | 3957598 B2 | 8/2007 |
| JP | 2010-008356 A | 1/2010 |
| WO | WO 2007/026603 A1 | 3/2007 |

OTHER PUBLICATIONS

Chinese Office Action issued in corresponding Chinese Application No. 201180003989.6 dated Dec. 6, 2013, with English translation of Search Report.

* cited by examiner

VEHICULAR INSULATION RESISTANCE DETECTION APPARATUS

RELATED APPLICATIONS

This application is the U.S. National Phase under 35 U.S.C. §371 of International Application No. PCT/JP2011/002986, filed on May 27, 2011, which in turn claims the benefit of Japanese Application No. 2010-194404, filed on Aug. 31, 2010, the disclosures of which Applications are incorporated by reference herein.

TECHNICAL FIELD

The present invention relates to a vehicular insulation resistance detection apparatus for detecting insulation resistance between a low-voltage circuit and a high-voltage circuit.

BACKGROUND ART

Recent years have seen widespread use of hybrid cars that use an engine and an electric motor in combination, as well as increasing use of electric cars. Such vehicles that use an electric motor as a power source are equipped with a high-voltage power source that outputs a high voltage of, for example, about 288 V to 600 V as the power source for driving the motor. Such a high-voltage power source is formed by a battery pack of a plurality of series-connected rechargeable batteries such as, for example, lithium ion rechargeable batteries or nickel metal hydride rechargeable batteries.

A high-voltage circuit, which is a circuit connected to the high-voltage power source, including the motor or an inverter to which power supply voltage is supplied from this high-voltage power source, or wires and the like for distributing the power supply voltage to the motor and the like, is insulated from the vehicle body. This structure thereby prevents a user from getting electric shocks when the user touches the vehicle body.

A lead storage battery of, for example, 12 V, is mounted in vehicles as a low-voltage power source for supplying power supply voltage to equipments that operate at a low voltage such as electrical equipments including in-vehicle stereos, lights, car navigation systems, or ECUs (Electronic Control Units), or the like. The body of the vehicle forms a circuit ground of a low-voltage circuit of electrical equipment or ECUs to which power supply voltage is supplied from this low-voltage power source. Namely, the vehicle body constitutes a circuit ground that is part of the low-voltage circuit, which is insulated from the high-voltage circuit.

Vehicles equipped with such high-voltage parts use an insulation resistance detection circuit that measures insulation resistance between the high-voltage circuit and the vehicle body (low-voltage circuit). For example, in the event of a ground fault due to, for example, a cable with damaged coating contacting the vehicle body, causing the insulation resistance between the high-voltage circuit and the vehicle body to drop, such a drop in the insulation resistance is detected by the insulation resistance detection circuit, and an alarm light in the in-vehicle instrument panel is turned on to draw attention from a passenger or a service man.

As such an insulation resistance detection circuit, a technique for detecting insulation resistance is conventionally known, wherein an alternating signal for measurement is output to a high-voltage circuit via a resistor and a capacitor (hereinafter referred to as a coupling capacitor), and a voltage appearing at a connection point between a resistor and the coupling capacitor is detected by an A/D converter, to detect insulation resistance from the signal amplitude of the detected voltage (see, for example, Patent Document 1). Since such an insulation resistance detection circuit itself is a low-voltage circuit, it is connected to the high-voltage circuit via the coupling capacitor to shut off DC current so as to maintain insulation between the high-voltage circuit and the low-voltage circuit.

In such an insulation resistance detection circuit, the signal amplitude mentioned above changes in accordance with a voltage divider ratio determined by the series impedance of the coupling capacitor and the insulation resistance, and the above-mentioned resistor, so that insulation resistance can be detected from the signal amplitude.

However, in the insulation resistance detection circuit described above, the moment a ground fault occurs, the voltage (potential) on the side of the insulation resistance detection circuit of the coupling capacitor undergoes an instantaneous change because of the high voltage of the high-voltage power source, whereby DC potential input to the A/D converter changes by several hundreds volts. Since the input voltage range of an A/D converter is typically about 5 V to 10 V, the voltage of the coupling capacitor falls out of the input voltage range of the A/D converter, as a result of which the above-mentioned signal amplitude becomes undetectable.

After that, the above-mentioned signal amplitude cannot be detected by the A/D converter until after the coupling capacitor has been charged and discharged by the alternating signal for measurement in accordance with a time constant thereof so that the voltage of the coupling capacitor has fallen back into the input voltage range of the A/D converter, and therefore, insulation resistance cannot be detected, either. This means there is a time lag between a drop in insulation resistance caused by a ground fault or the like and issuance of an alarm to a passenger or a service man, which is not desirable.

Since this time lag is caused by the time constant associated with charging and discharging of the coupling capacitor, reducing the capacitance of the coupling capacitor is assumed to shorten the time lag from occurrence of a ground fault until the insulation resistance becomes detectable.

However, the problem was that reducing the capacitance of the coupling capacitor would cause the voltage thereof more variable because of the influence of noise during driving of the vehicle or inverter noise and the like, which would lead to erroneous detection of insulation resistance and malfunctions.

Patent Document 1: Japanese Patent Application Laid-open No. 2004-104923

DISCLOSURE OF THE INVENTION

An object of the present invention is to provide a vehicular insulation resistance detection apparatus that can shorten the time from occurrence of a ground fault until the insulation resistance becomes detectable without reducing the capacitance of coupling capacitors.

The vehicular insulation resistance detection apparatus according to one aspect of the present invention is a vehicular insulation resistance detection apparatus that detects an insulation resistance between a low-voltage circuit and a high-voltage circuit, including: a cyclic signal generating unit that generates a cyclic signal which has a preset frequency; a first resistor that has one end which is connected to the cyclic signal generating unit, the cyclic signal being applied to the one end; a first capacitor that has one end which is connected to the other end of the first resistor and the other end which is connected to the high-voltage circuit; a second capacitor that has one end which is connected to the other end of the first resistor; a second resistor that has one end which is connected to the other end of the second capacitor and the other end which is connected to a low-voltage ground that is a circuit ground of the low-voltage circuit; a series circuit that includes a diode and a third resistor connected in series, and is connected in parallel with the second capacitor, the diode having a forward direction coincident with a direction from the other end of the second capacitor to the one end of the second capacitor; a voltage detection unit that detects a voltage between the low-voltage ground and the other end of the second capacitor as a detection signal; and an insulation resistance detection unit that detects a resistance value of the insulation resistance based on an amplitude of the detection signal.

BEST MODE FOR CARRYING OUT THE INVENTION

Figure 1:
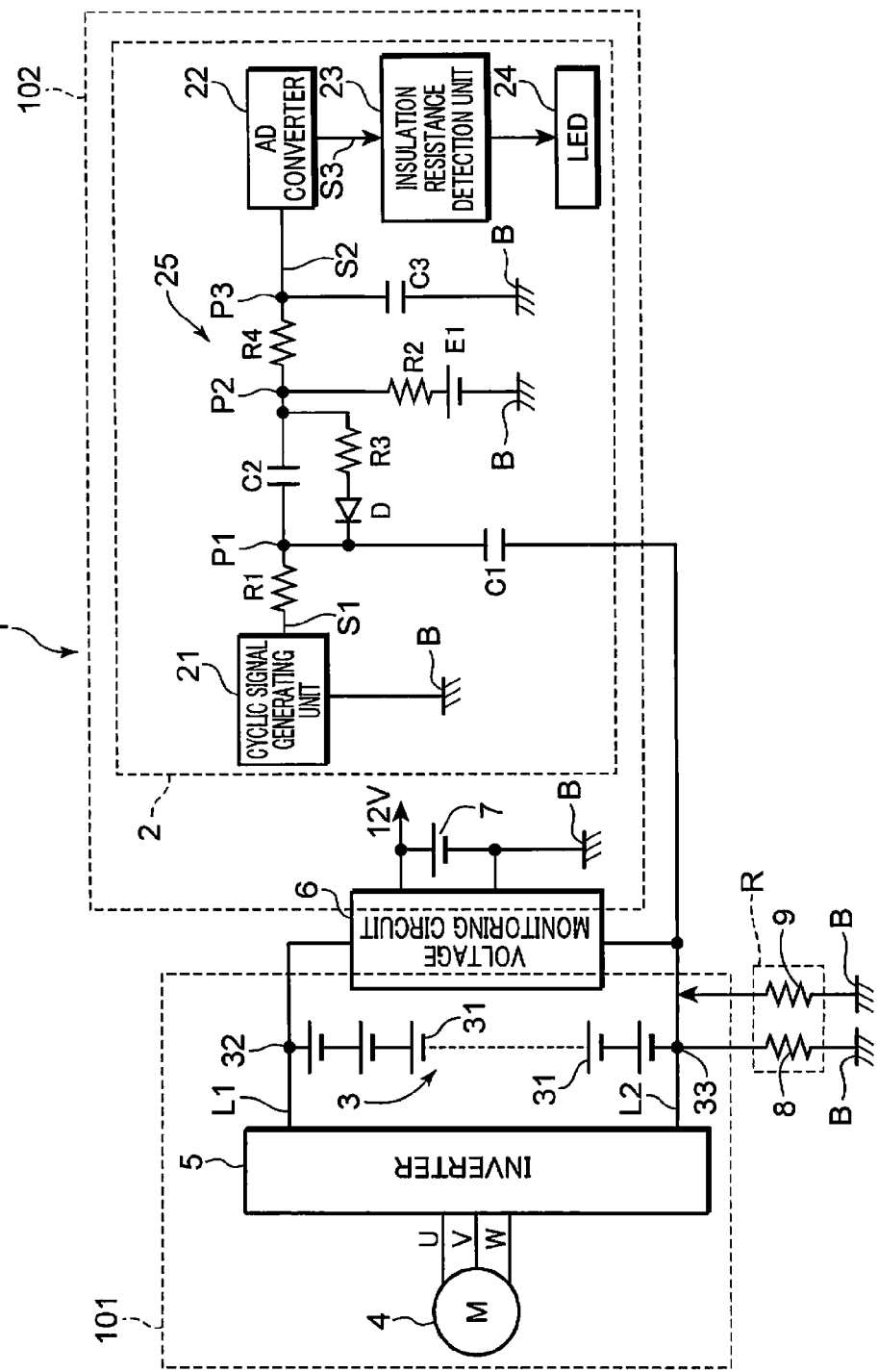
FIG. 1 is a circuit diagram showing one example of the configuration of the vehicle equipped with the insulation resistance detection apparatus according to one embodiment of the present invention.

Hereinafter, embodiments of the present invention will be described based on the drawings. Same reference numerals given to components in various drawings indicate that these are the same components and description thereof will be omitted. FIG. 1 is a circuit diagram showing one example of the configuration of the vehicle equipped with the insulation resistance detection apparatus according to one embodiment of the present invention. The vehicle 1 shown in FIG. 1 is an electric car such as, for example, a hybrid car or a fuel cell car. Vehicles here include various vehicles other than hybrid cars and fuel cell cars, such as electric cars that do not use an internal combustion engine, electric bicycles, and the like.

The vehicle 1 shown in FIG. 1 includes a motor 4, a battery pack 3, an inverter 5, a voltage monitoring circuit 6, a rechargeable battery 7, and an insulation resistance detection apparatus 2. The insulation resistance detection apparatus 2 is one example of the vehicular insulation resistance detection apparatus. The insulation resistance detection apparatus 2 includes a cyclic signal generating unit 21, an AD (Analog Digital) converter 22 (voltage detection unit), an insulation resistance detection unit 23, an LED (Light Emitting Diode) 24, a resistor R1 (first resistor), a coupling capacitor C1 (first capacitor), a capacitor C2 (second capacitor), a resistor R2 (second resistor), a constant voltage source E1 (intermediate voltage generating unit), a resistor R3 (third resistor), a diode D, a resistor R4, and a capacitor C3.

The battery pack 3, and the motor 4, the inverter 5, and part of the voltage monitoring circuit 6 connected to the battery pack 3, together form a high-voltage circuit 101. The rechargeable battery 7, and the insulation resistance detection apparatus 2 and part of the voltage monitoring circuit 6 connected to the rechargeable battery 7, together form a low-voltage circuit 102. The high-voltage circuit 101 is a circuit that uses a higher voltage than the low-voltage circuit 102, and insulated from the low-voltage circuit 102 to prevent the user from getting electric shocks. The voltage monitoring circuit 6 is provided to bridge across the high-voltage circuit 101 and the low-voltage circuit 102.

The insulation resistance detection apparatus 2 measures the resistance value r of insulation resistance R, which is the resistance between the high-voltage circuit 101 and the low-voltage circuit 102, and detects occurrence of a ground fault based on this resistance value r.

The battery pack 3 is formed by a plurality of rechargeable batteries 31, for example, about 240 to 500 nickel metal hydride rechargeable batteries that each output 1.2 V, connected in series, to output a high voltage of about 288 V to 600 V. If the vehicle is a fuel cell car, a fuel cell is used instead of the battery pack 3.

The inverter 5 converts DC voltage output from the battery pack 3 into three-phase power supply voltage U, V, and W for driving the motor. The inverter 5 has a switching frequency of 1 kHz to 50 kHz, for example.

The voltage monitoring circuit 6 is formed using, for example, an AD converter, and measures the terminal voltage of the battery pack 3, or the terminal voltage of discrete rechargeable batteries 31 forming the battery pack 3 and outputs the same to an ECU which is not shown. This ECU controls charging and discharging of the battery pack 3, as well as the operation of the inverter 5, in accordance with the terminal voltage of the battery pack 3 or of respective rechargeable batteries 31 measured by the voltage monitoring circuit 6. The rechargeable battery 7 provided separately from the battery pack 3 supplies operating power supply voltage to the voltage monitoring circuit 6.

The rechargeable battery 7 is a low-voltage power source for the low-voltage circuit 102, and formed by a 12 V lead storage battery, for example A power supply voltage of DC 12 V output from the rechargeable battery 7, and a power supply voltage of, for example 5 V, obtained by converting the 12 V power supply voltage by a power supply circuit (not shown), are supplied to various components of the low-voltage circuit 102 as the power supply voltage for operation.

The negative electrode of the rechargeable battery 7 is connected to the body of the vehicle 1, this vehicle body forming a low-voltage ground B, which is the circuit ground of the low-voltage circuit 102. This means that the battery pack 3 is connected to the low-voltage ground B, i.e., the vehicle body, through internal resistance of the voltage monitoring circuit 6.

In FIG. 1, the resistor 8 represents resistance generated by internal resistance and the like of the voltage monitoring circuit 6. The resistor 8 is set to have a resistance value of 500 kΩ or more when the output voltage of the battery pack 3 is 400 V, for example, so that a current of 1 mA or less, for example, flows through the resistor 8, in a normal state (when the resistor 9 is open). The current value of 1 mA is sufficiently lower than the perception current of humans which is 3 to 4 mA.

In the event of a ground fault accident where the wire L1 connected to the positive terminal 32 of the battery pack 3 or the wire L2 connected to the negative terminal 33 of the battery pack 3 contacts the vehicle body which is the low-voltage ground B, the resistor 9 representing ground fault resistance is connected in parallel with the resistor 8. The insulation resistance R is obtained as a combined resistance value of the resistor 8 and the resistor 9 connected in parallel.

Note, while FIG. 1 illustrates an example in which the resistor 9 is connected to the negative electrode 33, i.e., in which the wire L2 has contacted the vehicle body, since the battery pack 3 has a low internal resistance, the resistance generated when the wire L1 contacts the vehicle body is also represented by the resistor 9, as with the case when the wire L2 contacts the vehicle body.

The cyclic signal generating unit 21 is an oscillating circuit that generates a cyclic signal S1 of a preset frequency fs. The preset frequency fs is set to about 1 Hz to 10 Hz, for example, to be sufficiently lower than the switching frequency of the inverter 5, which is 1 kHz to 50 kHz. This ensures that the preset frequency fs will be lower than the frequency of the switching noise generated in the inverter 5. The cyclic signal generating unit 21 may output sine waves, or rectangular waves, as the cyclic signal S1.

The cyclic signal generating unit 21 operates at a power supply voltage of 5 V, for example, and outputs, as the cyclic signal S1, a signal with an amplitude (peak to peak voltage) of 5 V, i.e., a signal that changes within the range of ±2.5 V around 2.5 V as the center voltage.

One end of the resistor R1 is connected to the cyclic signal generating unit 21, while the other end of the resistor R1 is connected to one end of the coupling capacitor C1. The other end of the coupling capacitor C1 is connected to the negative terminal 33 of the battery pack 3, i.e., the high-voltage circuit 101. The cyclic signal generating unit 21 outputs the cyclic signal S1 to the negative terminal 33 via the series circuit of the resistor R1 and the coupling capacitor C1.

One end of the capacitor C2 is connected to a connection point P1 between the other end of the resistor R1 and the coupling capacitor C1, while the other end of the capacitor C2 is connected to the low-voltage ground B via the resistor R2 and the constant voltage source E1. The constant voltage source E1 is a constant voltage power supply circuit that outputs an intermediate voltage between an upper limit and a lower limit of the input voltage range of the AD converter 22.

If the input voltage range of the AD converter 22 is 0 V to 10 V, for example, the constant voltage source E1 outputs a voltage of 3.3 V, for example, which is higher than 2.5 V that is the half of the amplitude of the cyclic signal S1 output from the cyclic signal generating unit 21, and lower, by 2.5 V or more, than the upper limit of the input voltage range of the AD converter 22.

Thus the series circuit of the resistor R2 and the constant voltage source E1 raises the lower limit of the alternating signal coming from the connection point P1 and having passed the capacitor C2 to above 0 V. By making the upper limit of the alternating signal to 10 V or lower, the alternating signal that has passed through the capacitor C2 is adjusted to fall within the input voltage range of the AD converter 22.

The constant voltage source E1 is not absolutely necessary; the connection point P2 may be connected to the low-voltage ground B via the resistor R2.

Another alternative is to omit the constant voltage source E1 and to use an AD converter 22 having an input voltage range containing a negative voltage range of, for example, −5 V to +5 V.

One end of the resistor R3 is connected to the connection point P2 between the other end of the capacitor C2 and the resistor R2, while the other end of the resistor R3 is connected to the anode of the diode D, with the cathode of the diode D being connected to the connection point P1. Thus, the series circuit of the resistor R3 and the diode D is connected in parallel with the capacitor C2. The diode D is set to have its forward direction coincident with a direction from the connection point P2 to the connection point P1.

The positions of the diode D and the resistor R3 are interchangeable; the anode of the diode D may be connected to the connection point P2, while the cathode of the diode D may be connected to one end of the resistor R3, with the other end of the resistor R3 being connected to the connection point P1.

One end of the resistor R4 is connected to the connection point P2, while the other end of the resistor R4 is connected to one end of the capacitor C3, with the other end of the capacitor C3 being connected to the low-voltage ground B. The resistor R4 and the capacitor C3 constitute a low-pass filter 25.

The low-pass filter 25 has a cut-off frequency set to about 100 Hz, for example, which is higher than the preset frequency fs and lower than the switching frequency of the inverter 5.

The low-pass filter 25 is not absolutely necessary; the connection point P2 may be directly connected to the AD converter 22.

The AD converter 22 detects voltage at a connection point P3 between the resistor R4 and the capacitor C3 as a detection signal S2. The AD converter 22 sequentially converts the detection signal S2 into digital values and outputs the same as detected values S3 to the insulation resistance detection unit 23. The input voltage range of the AD converter 22 is 0 V to 10 V, for example, and therefore voltages outside of this input voltage range cannot be converted into digital values.

The AD converter 22 need not necessarily be formed by one element; the AD converter 22 may be formed by a combination of, for example, an amplifier and an AD converter.

The insulation resistance detection unit 23 is formed to include, for example, a CPU (Central Processing Unit), a RAM (Random Access Memory), a ROM (Read Only Memory), and peripheral circuits thereof, and the like. A control program stored in the ROM, for example, is executed, to obtain a resistance value r of insulation resistance R or abnormality in the insulation resistance R, e.g., a ground fault, based on the voltage value output from the AD converter 22.

More specifically, as shown in FIG. 1, the cyclic signal S1 output from the cyclic signal generating unit 21 is divided by a voltage divider ratio X obtained by the resistor R1 and the series circuit of the coupling capacitor C1 and the insulation resistance R, and this divided voltage appears at the connection point P1. This in turn changes the amplitude of the alternating signal appearing at the connection point P1 in accordance with the voltage divider ratio X. Since the voltage divider ratio X is determined in accordance with the resistance value r of insulation resistance R, the amplitude of the alternating signal appearing at the connection point P1 is also determined in accordance with the resistance value r of insulation resistance R.

The alternating signal that has thus appeared at the connection point P1 passes through the capacitor C2; the center of the signal amplitude is made to 3.3 V by the resistor R2 and the constant voltage source E1, and further inverter noise is reduced by the low-pass filter 25, before the alternating signal is input to the AD converter 22 as the detection signal S2. This means that the peak to peak voltage, or amplitude Vpp, of the detection signal S2 is also determined in accordance with the resistance value r of insulation resistance R, and that the lower the resistance value r, the lower the amplitude Vpp.

The insulation resistance detection unit 23 calculates the amplitude Vpp of the detection signal S2 by, for example, subtracting the lower limit peak value from the upper limit peak value of the detected values S3 that have been converted into digital values by the AD converter 22.

The amplitude Vpp is determined in accordance with the resistance value r of insulation resistance R as described above. Therefore, a corresponding relation between, for example, the amplitude Vpp and the resistance value r of insulation resistance R is preliminarily determined, and stored in the ROM as an LUT (Look Up Table). In this case the LUT stores the amplitude Vpp and the resistance value r corresponding to each other such that the lower the amplitude Vpp, the lower the resistance value r. The insulation resistance detection unit 23 obtains the resistance value r stored correspondingly to the amplitude Vpp in this LUT as the resistance value r of insulation resistance R.

If the resistance value r obtained from the amplitude Vpp is lower than a predetermined determination threshold of, for example, 40 kΩ, the insulation resistance detection unit 23 determines that this drop in the insulation resistance has resulted from a ground fault accident or the like, and causes the LED 24 provided in an in-vehicle instrument panel, for example, to emit light. The insulation resistance detection unit 23 thus notifies the passenger or service man of abnormality in insulation resistance.

A display device such as a liquid crystal display or the like may be provided instead of the LED 24, and the resistance value r calculated by the insulation resistance detection unit 23 or an alert message may be displayed on the display device.

Next, how the insulation resistance detection apparatus 2 configured as described above operates when a ground fault occurred will be described. FIG. 2 to FIG. 6 are graphs showing changes in detection signals S2 and detected values S3 obtained by simulating the operation of the insulation resistance detection apparatus 2 shown in FIG. 1. The horizontal axis represents the time elapsed after the start of the simulation (0 sec), and the vertical axis represents voltage.

Figure 7:
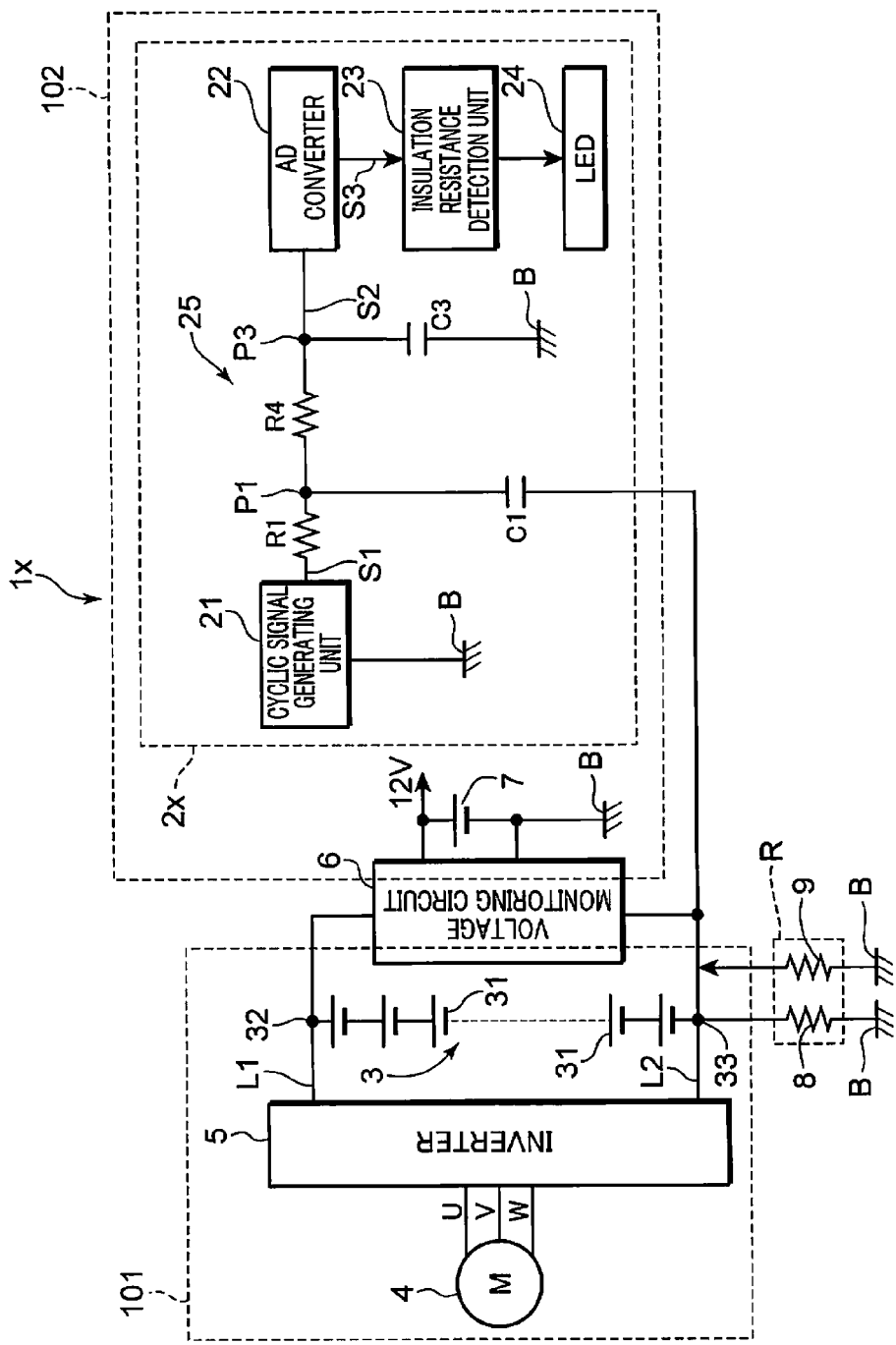
FIG. 7 is a circuit diagram showing an insulation resistance detection apparatus according to a comparative example.

FIG. 8 to FIG. 12 show the results of simulation carried out with a circuit of a comparative example shown in FIG. 7 to demonstrate the speed-up effect achieved by the capacitor C2, the resistors R2 and R3, and the diode D, of shortening the time from occurrence of a ground fault until the insulation resistance becomes detectable.

The conditions of the simulation shown in FIG. 2 to FIG. 12 were as follows: Preset frequency fs=2.5 Hz, resistor R1: 75 kΩ, resistor R2: 1 MΩ, resistor R3: 1 MΩ, resistor R4: 91 kΩ, coupling capacitor C1: 2.35 µF, capacitor C2: 1 µF, capacitor C3: 0.1 µF, constant voltage source E1: 3.3 V, input voltage range of AD converter 22: 0 V to 10 V, output voltage of battery pack 3: 400 V.

The insulation resistance detection apparatus 2x shown in FIG. 7 is a comparative example to demonstrate the effect achieved by the insulation resistance detection apparatus 2, and configured similarly to the insulation resistance detection apparatus 2 shown in FIG. 1, except that the capacitor C2, the resistors R2 and R3, the diode D, and the constant voltage source E1 in the insulation resistance detection apparatus 2 are not provided.

Figure 2:
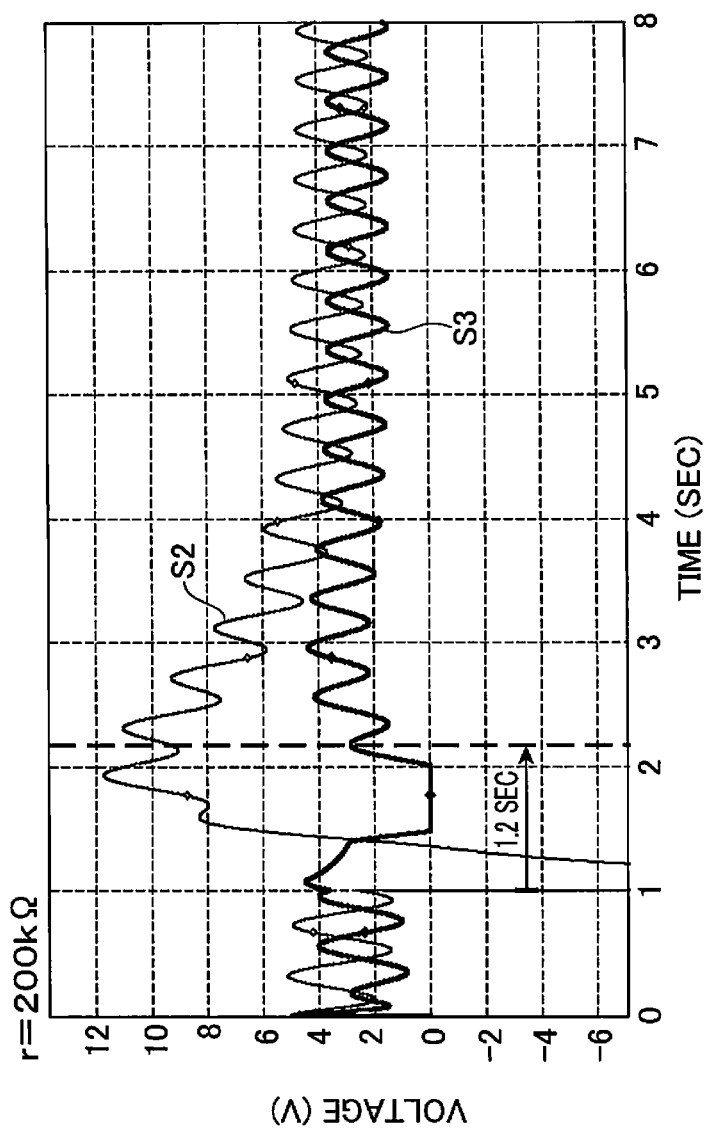
FIG. 2 is a graph showing changes in the detection signal and detected value obtained by simulating the operation of the insulation resistance detection apparatus shown in FIG. 1.
Figure 8:
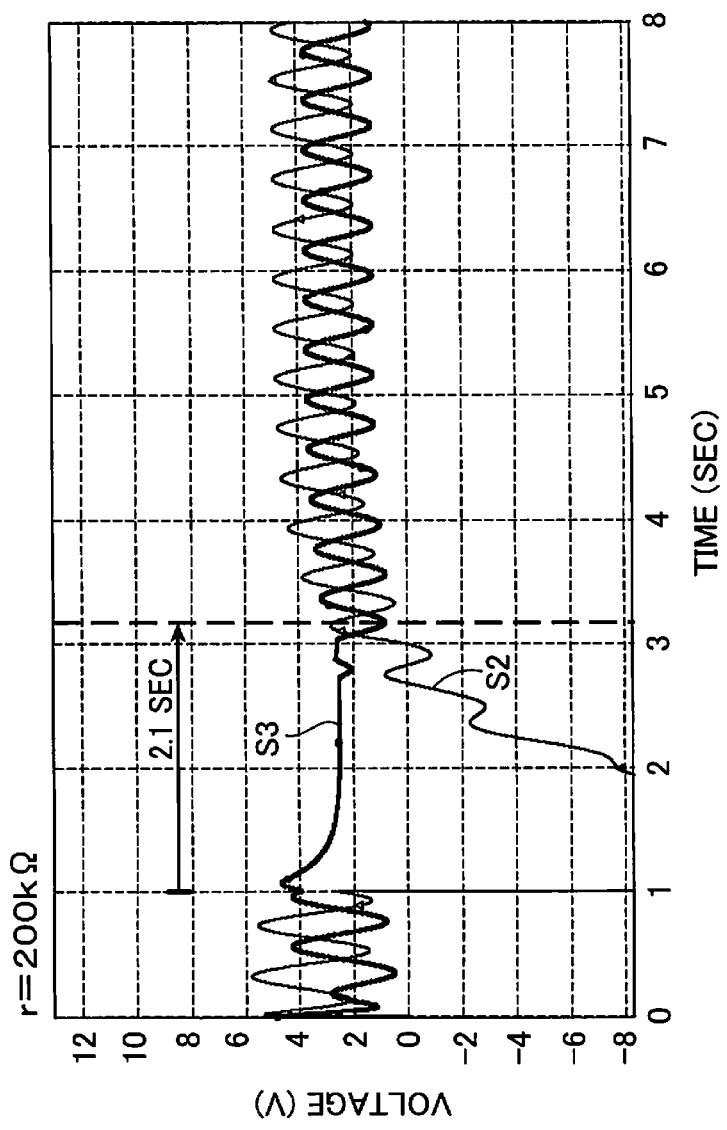
FIG. 8 is a graph showing changes in the detection signal and detected value obtained by simulating the operation of the comparative example shown in FIG. 7.

First, the operation of the insulation resistance detection apparatus 2 and that of the insulation resistance detection apparatus 2x which is a comparative example of the former when a ground fault occurred will be described with reference to FIG. 2 and FIG. 8. The graphs shown in FIG. 2 and FIG. 8 illustrate changes in the detection signal S2 and detected value S3 when a ground fault occurred at the timing when 1 second has elapsed, between the wire L1 on the positive electrode terminal 32 side of the battery pack 3 and the low-voltage ground B which is the vehicle body, with a resistance value r of insulation resistance R of 200 kΩ.

The moment a ground fault occurs at the timing when 1 second has elapsed, the voltage at the connection point P1 on the side of the resistor R1 of the coupling capacitor C1 plummets instantaneously because of the output voltage of the battery pack 3, whereby the detection signal S2 rapidly drops to below 0 V. The detection signal S2 thus falls out of the input voltage range of the AD converter 22 so that the AD converter 22 cannot detect the detection signal S2. As a result of the detected value S3 stopping to show the waveform of cyclic signals, the insulation resistance detection unit 23 cannot detect an amplitude Vpp, and therefore cannot detect the insulation resistance R.

After that, as the coupling capacitor C1 is gradually charged in accordance with the charging time constant thereof and the detection signal S2 exceeds 0 V, the AD converter 22 can again detect the detection signal S2. However, as shown FIG. 2, overshoot follows and the detection signal S2 exceeds 10 V, whereby the detection signal S2 again falls out of the input voltage range of the AD converter 22. Accordingly, until after 2.2 seconds have elapsed when the detection signal S2 has dropped again to fall within the input voltage range of the AD converter 22, the insulation resistance detection unit 23 cannot detect an amplitude Vpp, and therefore cannot detect the insulation resistance R.

Namely, the 1.2 seconds, from the timing when 1 second has elapsed when the ground fault occurred until 2.2 seconds have elapsed when the detection signal S2 has been stabilized and fallen within the input voltage range of the AD converter 22, are the time from occurrence of a ground fault until the insulation resistance becomes detectable. In FIG. 3 to FIG. 6 and FIG. 8 to FIG. 12 referred to below, the time from occurrence of a ground fault until the insulation resistance becomes detectable can be recognized similarly from the graphs.

With the example of the insulation resistance detection apparatus 2 shown in FIG. 2, the time from occurrence of a ground fault until the insulation resistance becomes detectable was about 1.2 seconds. On the other hand, with the comparative example shown in FIG. 8, the time from occurrence of a ground fault until the insulation resistance becomes detectable was about 2.1 seconds.

Thus it was confirmed that, in the event of a ground fault with a resistance value r of 200 kΩ, the insulation resistance detection apparatus 2 can shorten the time from occurrence of a ground fault until the insulation resistance becomes detectable by being equipped with the capacitor C2, the resistors R2 and R3, and the diode D.

Figure 3:
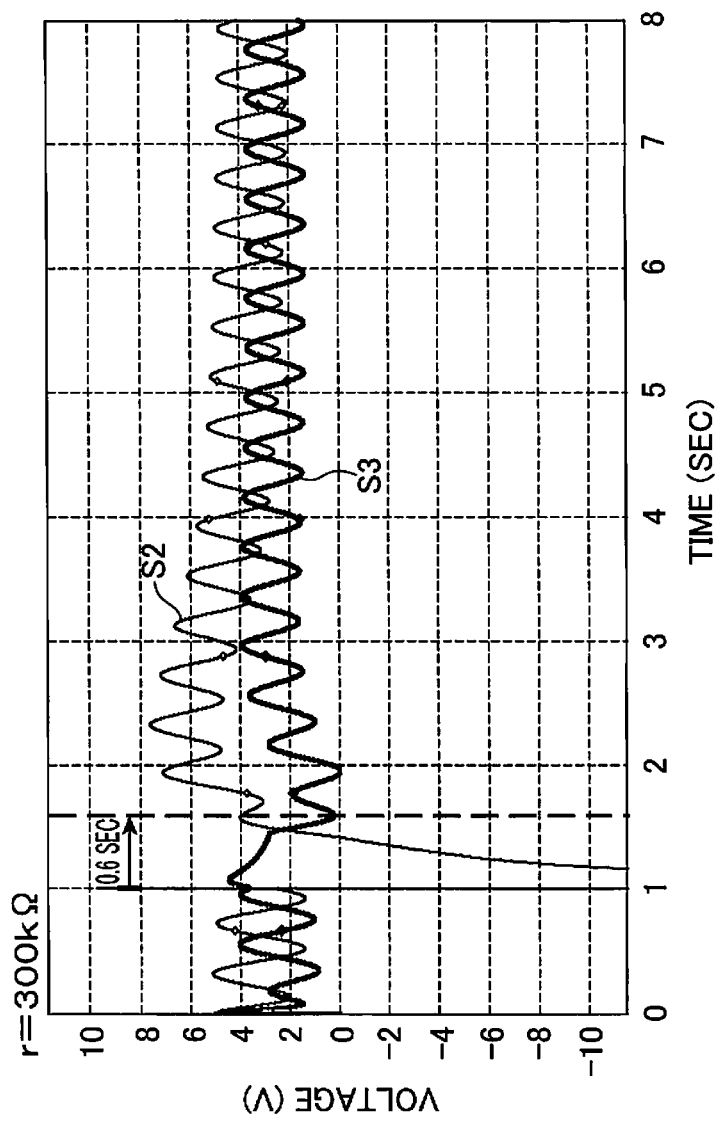
FIG. 3 is a graph showing changes in the detection signal and detected value obtained by simulating the operation of the insulation resistance detection apparatus shown in FIG. 1.
Figure 9:
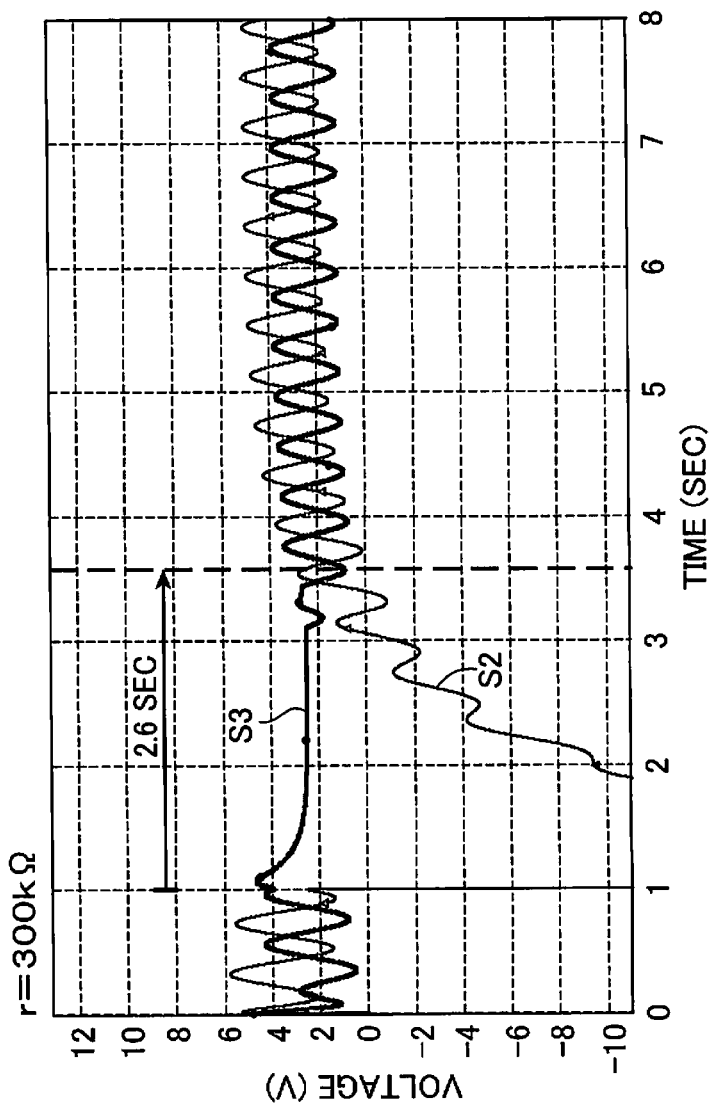
FIG. 9 is a graph showing changes in the detection signal and detected value obtained by simulating the operation of the comparative example shown in FIG. 7.

FIG. 3 and FIG. 9 are graphs showing the results of simulation with the example of the insulation resistance detection apparatus 2 and the comparative example, respectively, with a resistance value r of 300 kΩ when a ground fault occurred. While the time from occurrence of a ground fault until the insulation resistance becomes detectable was about 0.6 seconds with the example of the insulation resistance detection apparatus 2 as shown in FIG. 3, the time from occurrence of a ground fault until the insulation resistance becomes detectable was about 2.6 seconds with the comparative example shown in FIG. 9.

Figure 4:
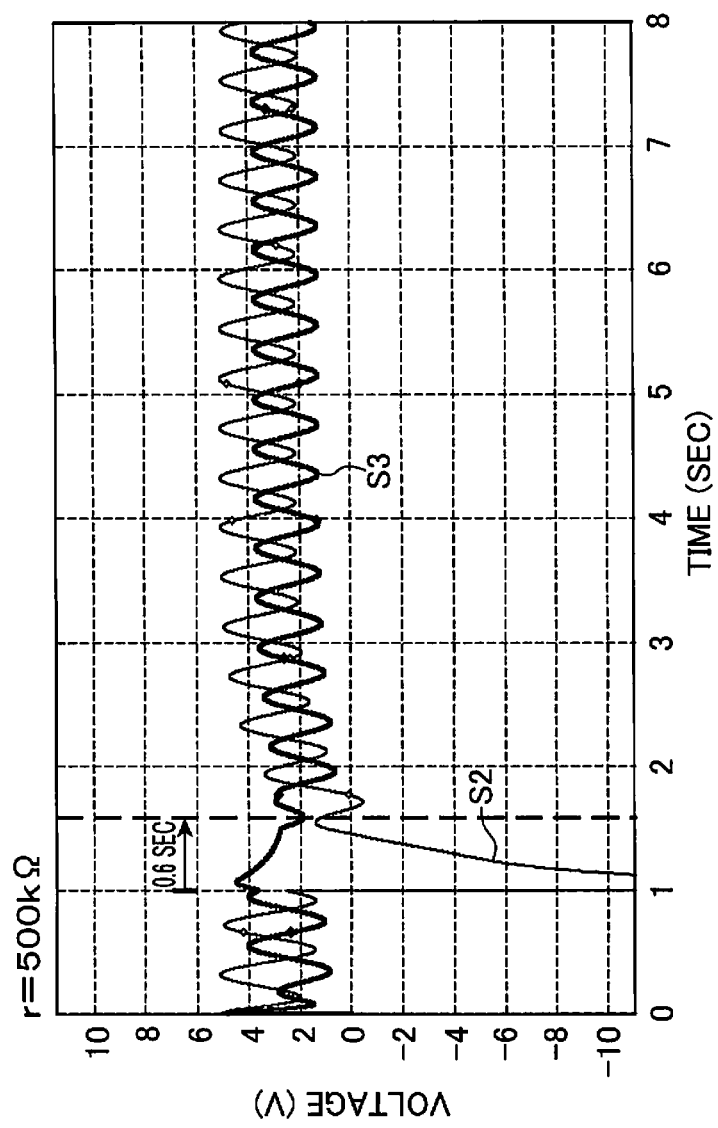
FIG. 4 is a graph showing changes in the detection signal and detected value obtained by simulating the operation of the insulation resistance detection apparatus shown in FIG. 1.
Figure 10:
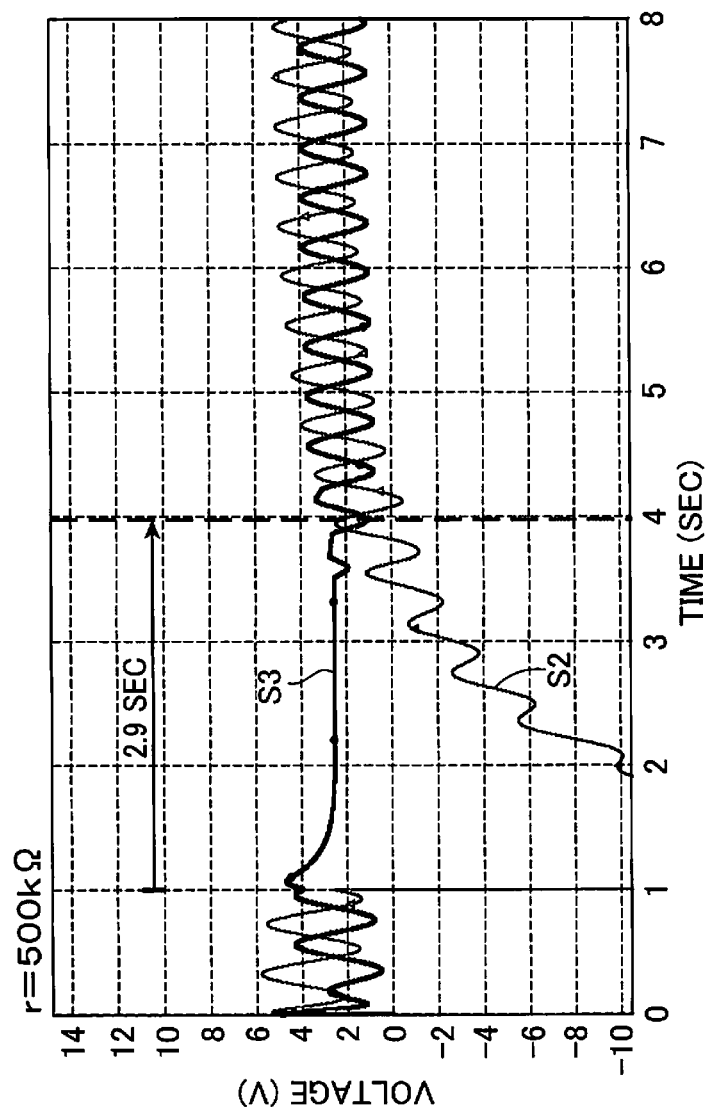
FIG. 10 is a graph showing changes in the detection signal and detected value obtained by simulating the operation of the comparative example shown in FIG. 7.

FIG. 4 and FIG. 10 are graphs showing the results of simulation with the example of the insulation resistance detection apparatus 2 and the comparative example, respectively, with a resistance value r of 500 kΩ when a ground fault occurred. While the time from occurrence of a ground fault until the insulation resistance becomes detectable was about 0.6 seconds with the example of the insulation resistance detection apparatus 2 as shown in FIG. 4, the time from occurrence of a ground fault until the insulation resistance becomes detectable was about 2.9 seconds with the comparative example shown in FIG. 10.

Figure 5:
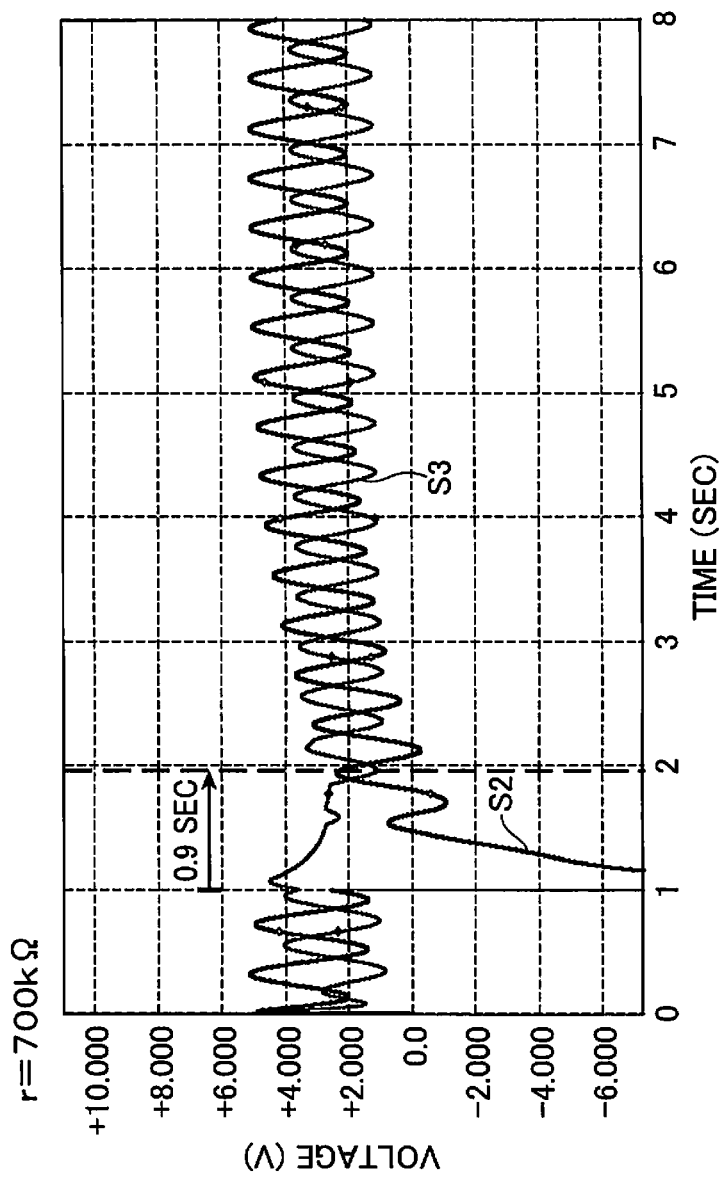
FIG. 5 is a graph showing changes in the detection signal and detected value obtained by simulating the operation of the insulation resistance detection apparatus shown in FIG. 1.
Figure 11:
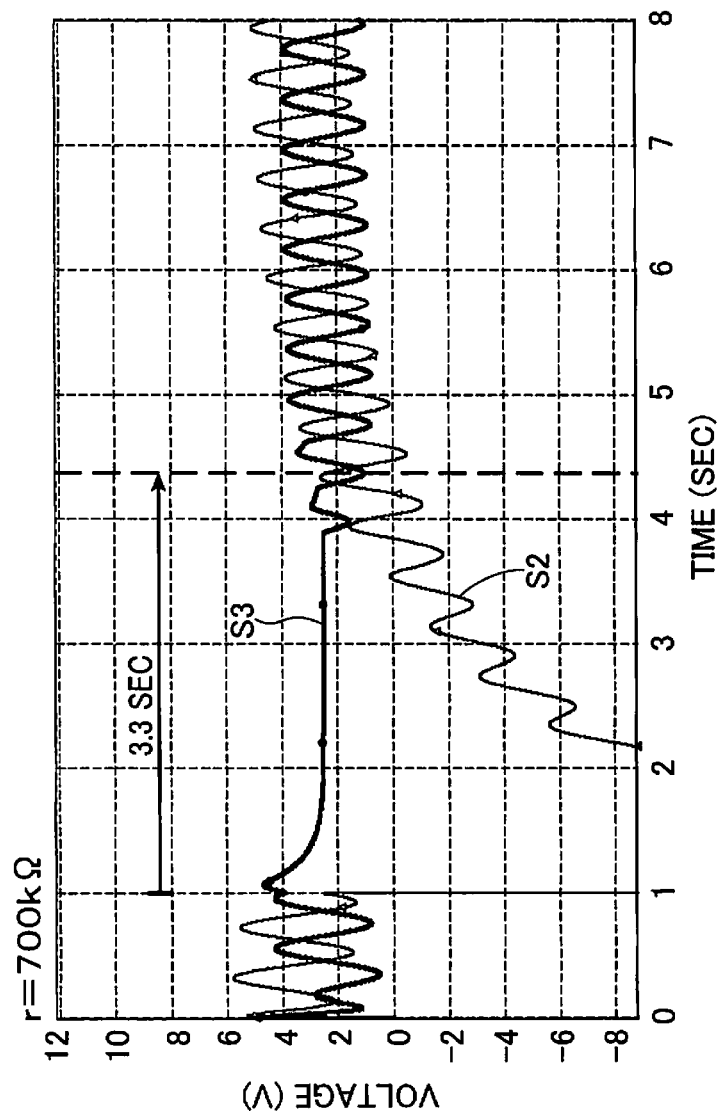
FIG. 11 is a graph showing changes in the detection signal and detected value obtained by simulating the operation of the comparative example shown in FIG. 7.

FIG. 5 and FIG. 11 are graphs showing the results of simulation with the example of the insulation resistance detection apparatus 2 and the comparative example, respectively, with a resistance value r of 700 kΩ when a ground fault occurred. While the time from occurrence of a ground fault until the insulation resistance becomes detectable was about 0.9 seconds with the example of the insulation resistance detection apparatus 2 as shown in FIG. 5, the time from occurrence of a ground fault until the insulation resistance becomes detectable was about 3.3 seconds with the comparative example shown in FIG. 11.

Figure 6:
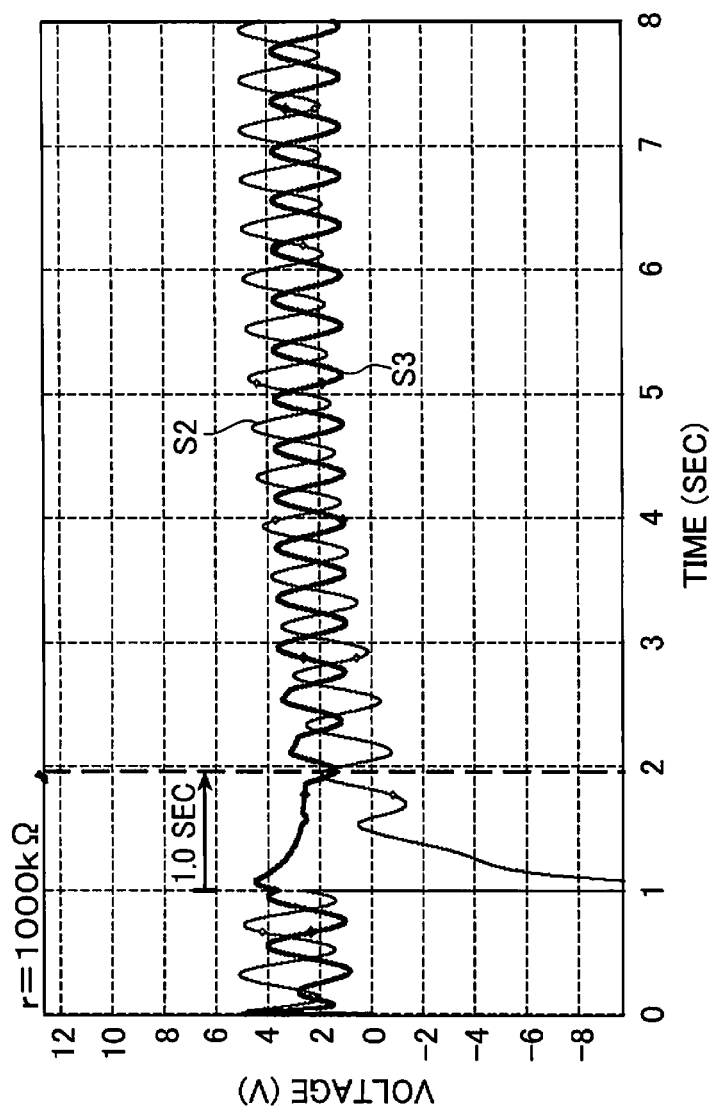
FIG. 6 is a graph showing changes in the detection signal and detected value obtained by simulating the operation of the insulation resistance detection apparatus shown in FIG. 1.
Figure 12:
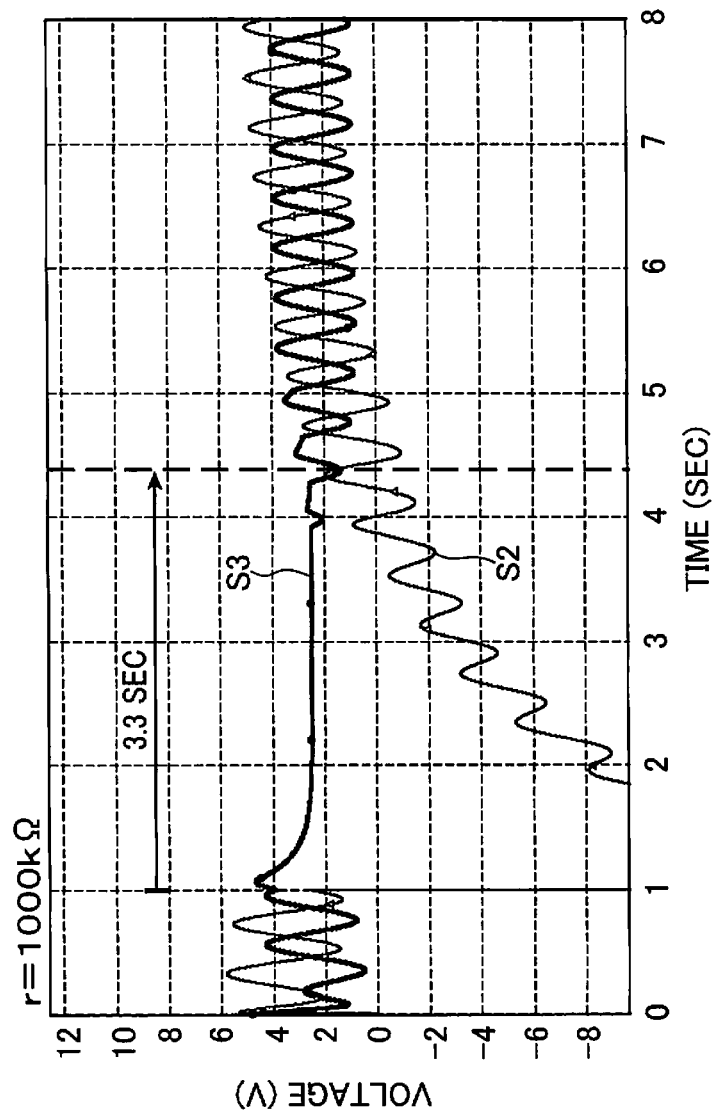
FIG. 12 is a graph showing changes in the detection signal and detected value obtained by simulating the operation of the comparative example shown in FIG. 7.

FIG. 6 and FIG. 12 are graphs showing the results of simulation with the example of the insulation resistance detection apparatus 2 and the comparative example, respectively, with a resistance value r of 1000 kΩ when a ground fault occurred. While the time from occurrence of a ground fault until the insulation resistance becomes detectable was about 1.0 second with the example of the insulation resistance detection apparatus 2 as shown in FIG. 6, the time from occurrence of a ground fault until the insulation resistance becomes detectable was about 3.3 seconds with the comparative example shown in FIG. 12.

Figure 13:
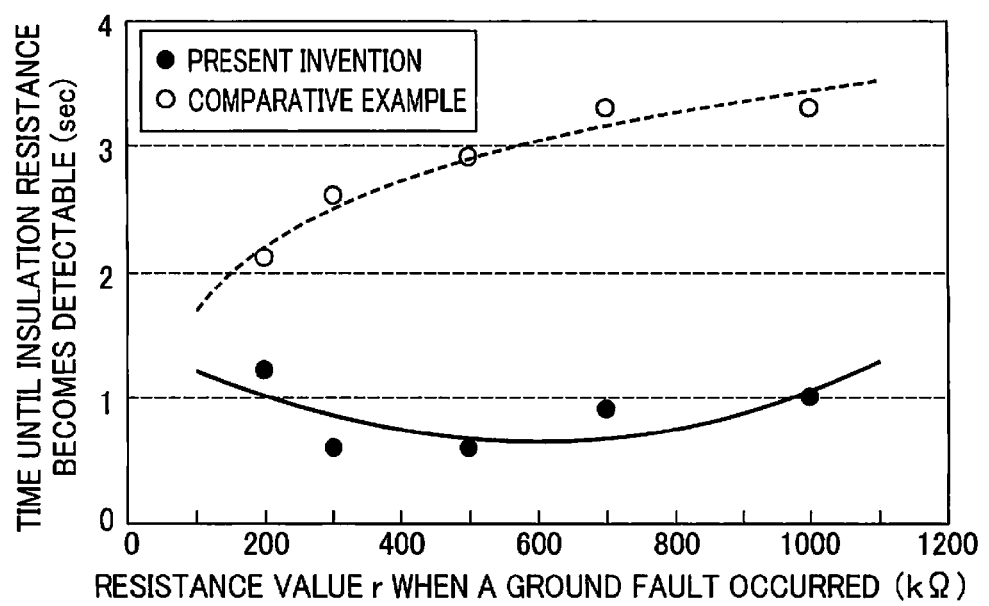
FIG. 13 is a graph showing the relation between the resistance value r when a ground fault occurred and the time until the insulation resistance becomes detectable with respect to examples according to the present invention and comparative examples.

As demonstrated above, it was confirmed that the time from occurrence of a ground fault until the insulation resistance becomes detectable was shorter in the insulation resistance detection apparatus 2 equipped with the capacitor C2, the resistors R2 and R3, and the diode D, than the comparative example not equipped with the capacitor C2, the resistors R2 and R3, and the diode D, under the conditions where the coupling capacitor C1 had the same capacitance, in any of the cases with the resistance values r of 200 kΩ, 300 kΩ, 500 kΩ, 700 kΩ, and 1000 kΩ when a ground fault occurred. Also, as shown in FIG. 13, it can be seen from the relation between the resistance value r when a ground fault occurred and the time until the insulation resistance becomes detectable that the insulation resistance detection apparatus 2 equipped with the capacitor C2, the resistors R2 and R3, and the diode D can shorten the time until the insulation resistance becomes detectable when the resistance value r is 200 kΩ or more.

Namely, the vehicular insulation resistance detection apparatus according to one aspect of the present invention is a vehicular insulation resistance detection apparatus that detects an insulation resistance between a low-voltage circuit and a high-voltage circuit, including: a cyclic signal generating unit that generates a cyclic signal which has a preset frequency; a first resistor that has one end which is connected to the cyclic signal generating unit, the cyclic signal being applied to the one end; a first capacitor that has one end which is connected to the other end of the first resistor and the other end which is connected to the high-voltage circuit; a second capacitor that has one end which is connected to the other end of the first resistor; a second resistor that has one end which is connected to the other end of the second capacitor and the other end which is connected to a low-voltage ground that is a circuit ground of the low-voltage circuit; a series circuit that includes a diode and a third resistor connected in series, and is connected in parallel with the second capacitor, the diode having a forward direction coincident with a direction from the other end of the second capacitor to the one end of the second capacitor; a voltage detection unit that detects a voltage between the low-voltage ground and the other end of the second capacitor as a detection signal; and an insulation resistance detection unit that detects a resistance value of the insulation resistance based on an amplitude of the detection signal.

The present inventors found out that, with this configuration, the time from occurrence of a ground fault until the insulation resistance becomes detectable could be shortened without reducing the capacitance of the coupling capacitor.

It is preferable that the apparatus further includes an intermediate voltage generating unit that generates an intermediate voltage between an upper limit and a lower limit of a voltage range detectable by the voltage detection unit, wherein the other end of the second resistor is connected to the low-voltage ground via the intermediate voltage generating unit.

With this configuration, an offset voltage of an alternating signal, which is obtained by dividing the cyclic signal by means of the first resistor and the series circuit of the first capacitor and the insulation resistance, after passing through the second capacitor, is adjusted to an intermediate voltage between an upper limit and a lower limit of the voltage range detectable by the voltage detection unit by the series circuit of the second resistor and the intermediate voltage generating unit. Thus, the voltage of the detection signal can easily be made within the voltage range detectable by the voltage detection unit.

Further, it is preferable that the preset frequency is a frequency lower than a frequency of noise generated in the high-voltage circuit, that the vehicular insulation resistance detection apparatus further includes a low-pass filter that has a cut-off frequency which is lower than a frequency of noise generated in the high-voltage circuit and higher than the preset frequency, that the low-pass filter is connected between the other end of the second capacitor and the voltage detection unit, and that the voltage detection unit detects the detection signal via the low-pass filter.

With this configuration, a noise component generated in the high-voltage circuit is reduced from the detection signal by the low-pass filter. As a result, detection accuracy of the insulation resistance detected by the insulation resistance detection unit based on the amplitude of the detection signal is improved.

Further, it is preferable that the insulation resistance detection unit detects a lower resistance value of the insulation resistance as the amplitude of the detection signal is lowered.

The amplitude of the detection signal is determined by a voltage divider ratio obtained by the first resistor and the series circuit of the first capacitor and the insulation resistance. The voltage divider ratio changes in accordance with the resistance value of insulation resistance. The lower the resistance value of insulation resistance, the lower the amplitude of the detection signal. Thus the insulation resistance detection unit can determine the resistance value of insulation resistance by detecting a resistance value of insulation resistance, which is lower the lower the amplitude of the detection signal is.

Further, it is preferable that the insulation resistance detection unit determines that there is an abnormality in the insulation resistance when the amplitude of the detection signal becomes lower than a predetermined determination threshold.

The lower the resistance value of insulation resistance, the lower the amplitude of the detection signal, as described above. Thus, by preliminarily setting a suitable determination threshold, the insulation resistance detection unit can determine that there is an abnormality in the insulation resistance when the amplitude of the detection signal becomes lower than the predetermined determination threshold.

The insulation resistance detection apparatus with such a configuration can shorten the time from occurrence of a ground fault until the insulation resistance becomes detectable without reducing the capacitance of the coupling capacitor.

This application is based on Japanese Patent Application No. 2010-194404 filed on Aug. 31, 2010, the contents of which are herein incorporated.

The specific embodiments and examples described in the section of the mode for carrying out the invention are given only for the purpose of clarifying the technical contents of the present invention. The invention should not be narrowly interpreted to be limited only to such specific examples, but rather, the invention can be embodied with various modifications within the spirit of the present invention and the scope of the claims stated in the following.

INDUSTRIAL APPLICABILITY

The invention can favorably be used as the vehicular insulation resistance detection apparatus that detects insulation resistance in hybrid cars, electric cars, and other vehicles having high-voltage parts.

The invention claimed is:

1. A vehicular insulation resistance detection apparatus that detects an insulation resistance between a low-voltage circuit and a high-voltage circuit, comprising:
   a cyclic signal generating unit that generates a cyclic signal which has a preset frequency;
   a first resistor that has one end which is connected to the cyclic signal generating unit, the cyclic signal being applied to the one end;
   a first capacitor that has one end which is connected to an other end of the first resistor and an other end which is connected to the high-voltage circuit;
   a second capacitor that has one end which is connected to the other end of the first resistor;
   a second resistor that has one end which is connected to an other end of the second capacitor and an other end which is connected to a low-voltage ground that is a circuit ground of the low-voltage circuit;
   a series circuit that includes a diode and a third resistor connected in series, and is connected in parallel with the second capacitor, the diode having a forward direction coincident with a direction from the other end of the second capacitor to the one end of the second capacitor;
   a voltage detection unit that detects a voltage between the low-voltage ground and the other end of the second capacitor as a detection signal; and
   an insulation resistance detection unit that detects a resistance value of the insulation resistance based on an amplitude of the detection signal.

2. The vehicular insulation resistance detection apparatus according to claim 1, further comprising an intermediate voltage generating unit that generates an intermediate voltage between an upper limit and a lower limit of a voltage range detectable by the voltage detection unit, wherein
   the other end of the second resistor is connected to the low-voltage ground via the intermediate voltage generating unit.

3. The vehicular insulation resistance detection apparatus according to claim 1, wherein
   the preset frequency is a frequency lower than a frequency of noise generated in the high-voltage circuit,
   the vehicular insulation resistance detection apparatus further comprises a low-pass filter that has a cut-off frequency which is lower than a frequency of noise generated in the high-voltage circuit and higher than the preset frequency,
   the low-pass filter is connected between the other end of the second capacitor and the voltage detection unit, and
   the voltage detection unit detects the detection signal via the low-pass filter.

4. The vehicular insulation resistance detection apparatus according to claim 1, wherein the insulation resistance detection unit detects a lower resistance value of the insulation resistance as the amplitude of the detection signal is lowered.

5. The vehicular insulation resistance detection apparatus according to claim 1, wherein the insulation resistance detection unit determines that there is an abnormality in the insulation resistance when the amplitude of the detection signal becomes lower than a predetermined determination threshold.

* * * * *